United States Patent
Mroz et al.

[11] Patent Number: 6,024,330
[45] Date of Patent: Feb. 15, 2000

[54] UNI-AXIAL FLOOR ANCHOR AND LEVELER FOR RACKS

[75] Inventors: Stephen P. Mroz, Rochester, Minn.; John S. Corbin, Jr., Austin, Tex.

[73] Assignee: International Business Machines Corporation, Armonk, N.Y.

[21] Appl. No.: 09/085,152

[22] Filed: May 27, 1998

[51] Int. Cl.[7] .................................................. F16M 11/24
[52] U.S. Cl. ...................... 248/188.4; 248/650; 248/680; 52/126.7; 52/705
[58] Field of Search .............................. 248/188.2, 188.4, 248/188.5, 188.1, 649, 650, 673, 677, 680, 354.3, 635; 52/126.7, 126.4, 126.1, 298, 705; 312/351.13, 351.14

[56] References Cited

U.S. PATENT DOCUMENTS

| | | | |
|---|---|---|---|
| 944,461 | 12/1909 | Olander | 248/188.4 |
| 1,321,081 | 11/1919 | Behn | 248/188.2 X |
| 2,476,366 | 7/1949 | Grimm | 248/188.4 |
| 2,940,784 | 6/1960 | Fell | 248/650 X |
| 3,100,099 | 8/1963 | Schaefer | 248/188.4 |
| 3,669,393 | 6/1972 | Paine et al. | 248/188.4 |
| 3,955,122 | 5/1976 | Maynard et al. | 371/710 |
| 3,971,537 | 7/1976 | Winkle et al. | 248/188.4 X |
| 4,108,407 | 8/1978 | Cable et al. | 248/188.4 X |
| 4,711,135 | 12/1987 | Horiuchi et al. | 248/635 X |
| 5,511,760 | 4/1996 | Kambara | 248/188.4 X |

Primary Examiner—Ramon O. Ramirez
Assistant Examiner—Stephen S. Wentsler
Attorney, Agent, or Firm—Andrew J. Dillon; Michael E. Noe

[57] ABSTRACT

A floor anchor and leveler system for an electronic equipment rack has a leveler shaft welded or otherwise rigidly attached at the upper end to a perpendicular base plate. A leveler foot and jam nut threads onto the leveler shaft. A threaded bolt extends coaxially through the leveler shaft and engages a floor plate which is rigidly attached to the floor using anchor bolts or other means. The jam nut and leveler foot are loosely threaded onto the leveler shaft, sufficiently high to allow the caster to contact and roll on the floor. The rack is positioned on its casters until each of the floor anchor and leveler systems, which are each attached to an underside of the rack, is located and centered above its corresponding threaded floor plate anchor hole. After positioning the rack, a tie-down bolt is installed coaxially through each leveler shaft and loosely engages the threaded floor plate and anchor hole. Each leveler foot is adjusted vertically to a desired position and the jam nut is tightened to lock the position. The tie-down bolts are then torqued to specification to securely anchor the leveled rack to the floor.

2 Claims, 3 Drawing Sheets

UNI-AXIAL FLOOR ANCHOR AND LEVELER FOR RACKS

TECHNICAL FIELD

This invention relates in general to floor mounting devices for portable electronic equipment racks and in particular to a floor mounting device with integrated anchoring and leveling capabilities for a portable electronic equipment rack.

BACKGROUND ART

Portable electronic equipment rack products which may be exposed to extreme environmental conditions such as earthquakes, tremors and the like, must be able to survive and continue to perform. In such locations, the lower surfaces of the rack products are usually physically anchored to the floor. Typically, the racks are also equipped with leveling devices to compensate for floor irregularities and to allow for a plumb installation.

Existing floor anchor and leveling designs comprise two separate systems. After a rack is properly positioned in a floor space, system leveling is achieved by individually adjusting and locking a leveler foot near each corner of the rack. The rack can then be anchored to the floor, typically using a series of anchoring bolts which attach a lower portion of the rack to floor plates that have been previously installed. The anchor bolts are torqued to a high level to keep them in tension during the anticipated earthquake and thus place the levelers in compression.

The preloading on the anchor bolts provides good lateral restraint of the rack due to friction, and eliminates any load fluctuations that might produce loosening or fatigue of the bolts. Unfortunately, the high preload forces, usually several thousand pounds, also require the base of the rack to be very stiff. In addition, if the rack floor stiffness is inadequate and cannot accommodate the bending loads exerted by the floor anchors and levelers, then the required preload cannot be achieved, if at all, without excessive deformation of the rack floor.

DISCLOSURE OF THE INVENTION

A floor anchor and leveler system for an electronic equipment rack comprises a leveler shaft welded or otherwise rigidly attached at the upper end to a perpendicular base plate. A leveler foot and jam nut threadingly engage the leveler shaft. A threaded bolt extends coaxially through the leveler shaft and engages a floor plate which is rigidly attached to the floor using anchor bolts or other means.

The jam nut and leveler foot are loosely threaded onto the leveler shaft, sufficiently high to allow the caster to contact and roll on the floor. The rack is then positioned on its casters until each of the floor anchor and leveler systems, which are each attached to an underside of the rack, is located and centered above its corresponding threaded floor plate anchor hole. After positioning the rack, the four tie-down bolts are each installed coaxially through each leveler shaft and loosely engage the threaded floor plate and anchor holes. Each leveler foot is then adjusted vertically to a desired position and the jam nut is tightened to lock the position. The tie-down bolts are then tightened to a prescribed specification to securely anchor the leveled rack to the floor.

BEST MODE FOR CARRYING OUT THE INVENTION

Figure 1:
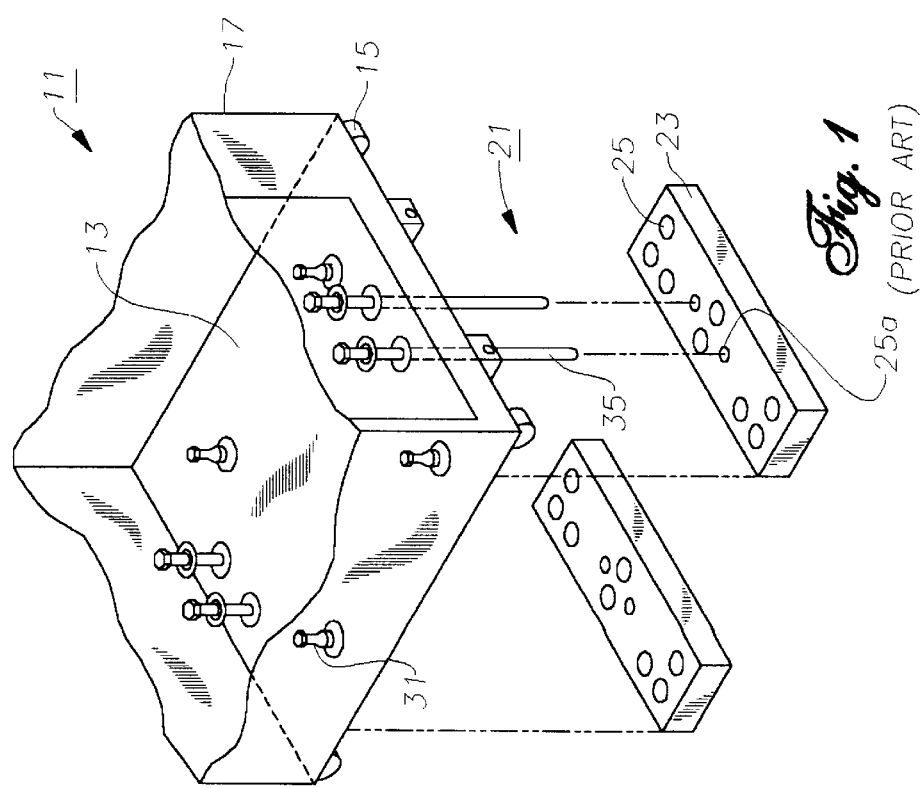
FIG. 1 is a partial front isometric view of a prior art floor anchor and leveler system for a rack.

Referring to FIG. 1, a conventional, portable electronics equipment rack 11 is shown. Rack 11 has a base 13 with a caster 15 located near each corner on a lower surface. Four vertical side walls 17 extend upward from base 13. Rack 11 is designed to house and provide access to electronics equipment (not shown).

A prior art floor anchor and leveler system 21 is shown installed on base of rack 11. System 21 comprises a pair of floor mounting plates 23, each of which has a plurality of holes 25 extending vertically therethrough. Mounting plates 23 are mounted directly to the floor at a selected floor site with fasteners (not shown), typically concrete expansion anchors, which are each installed through holes 25. Mounting plates 23 should be carefully positioned prior to installation such that threaded holes 25a will align with the other components of system 21.

After rack 11 is properly positioned over mounting plates 23, a set of four leveling feet 31 are used to compensate for floor irregularities and to give rack 11 a plumb installation. Each leveling foot 31 is a threaded bolt which extends through a threaded receptacle in base 13 near each of its corners. Leveling feet 31 do not engage mounting plates 23 and may be vertically adjusted up or down. A lock nut (not shown) located on the lower side of base 13 is then used to lock each leveling foot 31 from further vertical movement relative to base 13.

When rack 11 is plumb, a set of four rack mounting or anchor bolts 35 are inserted through holes in base 13. Each anchor bolt 35 should align with and engage a threaded hole 25a in a mounting plate 23. Anchor bolts 35 are then torqued to a level which is designed to keep them in tension under all conditions. The high tension loads placed on anchor bolts 35 place the leveling feet 31 in compression and impose large bending loads on base 13.

Figure 2:
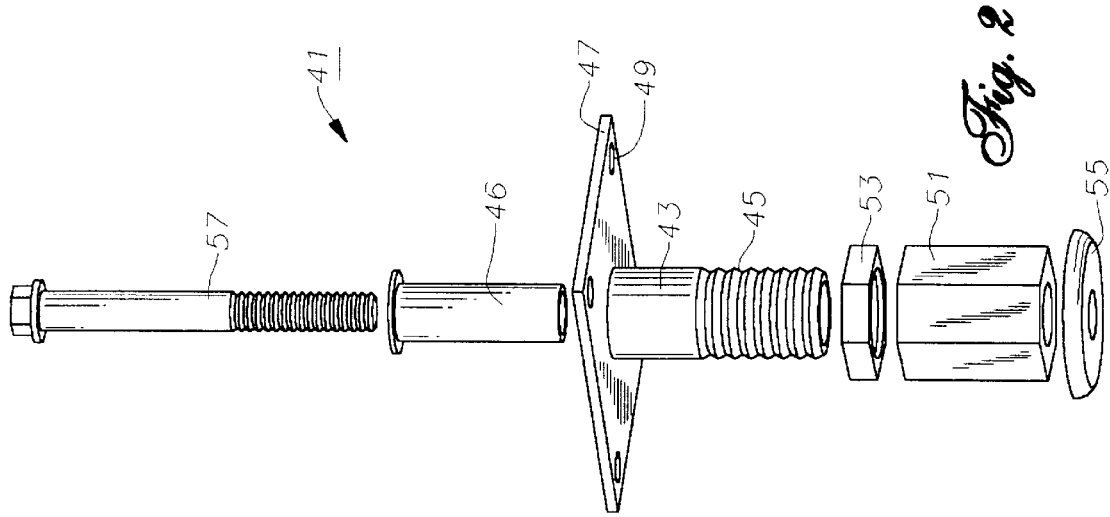
FIG. 2 is an exploded isometric view of a rack floor anchor and leveler system constructed in accordance with the invention.
Figure 4:
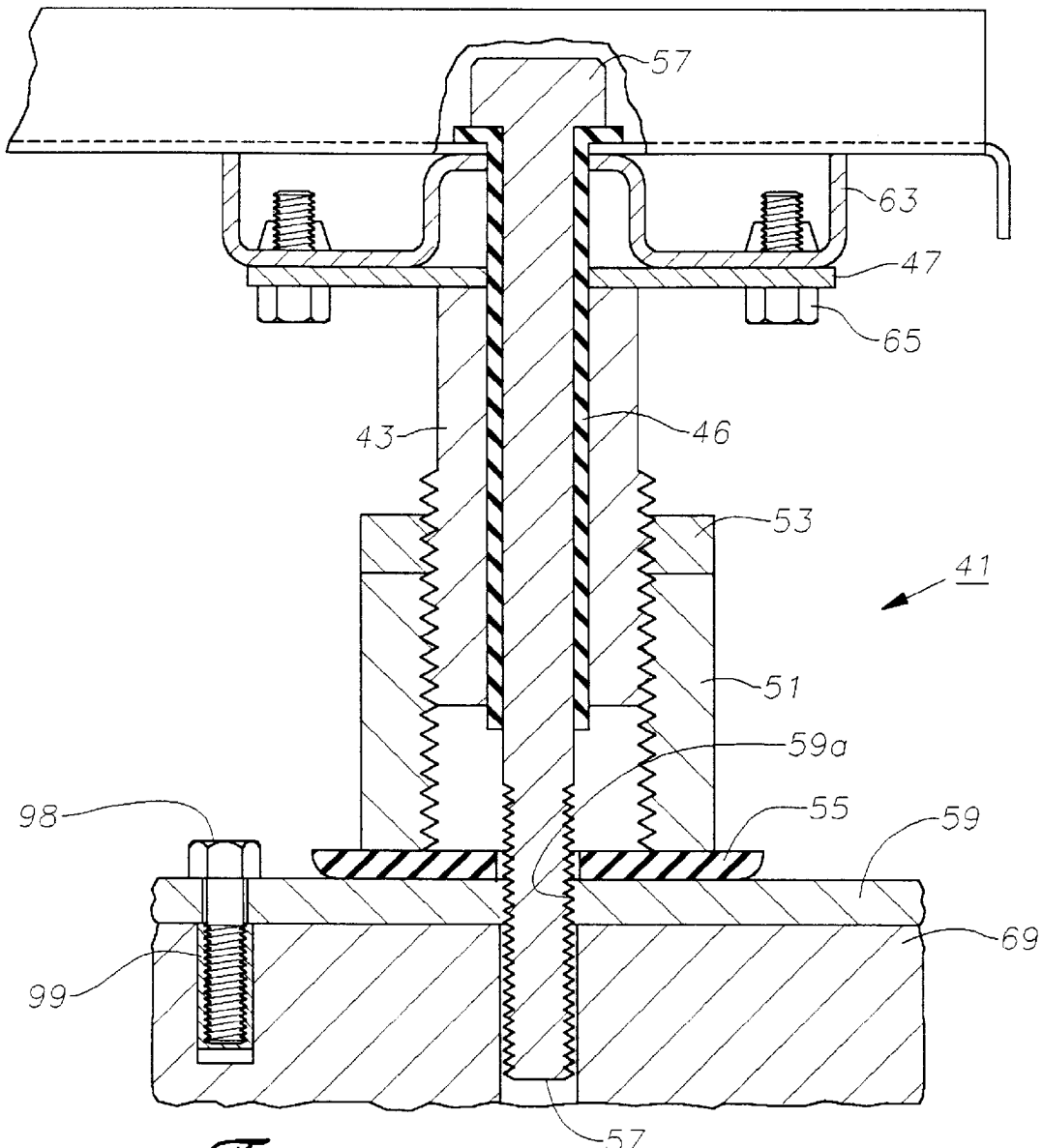
FIG. 4 is a sectional side view of the floor anchor and leveler system of FIG. 3 shown mounted to a floor.

Referring now to FIG. 2, a floor anchor and leveler system 41 of the present invention is shown. System 41 comprises a cylindrical coupling or leveler shaft 43 having external threads 45, an internal insulator sleeve 46 (FIG. 4) and a perpendicular base plate 47 rigidly mounted or welded to the upper end of the leveler shaft. Insulator sleeve 46 is provided since some installations require electrical isolation between the rack and the floor. Base plate 47 has a hole 49 located near each of its corners. A leveler foot 51 and jam nut 53 threadingly engage threads 45 on leveler shaft 43. Leveler foot 51 has an insulator foot 55 secured to its lower end. System 41 also comprises a long threaded tie-down bolt 57 and a floor mounting plate 59 with (FIG. 4). As shown in FIG. 4, floor mounting plate 59 is mounted directly to floor 69 at a selected floor site with fasteners 98. Fasteners 98 are secured to concrete expansion anchors 99 or the like which are mounted in floor 69.

Figure 3:
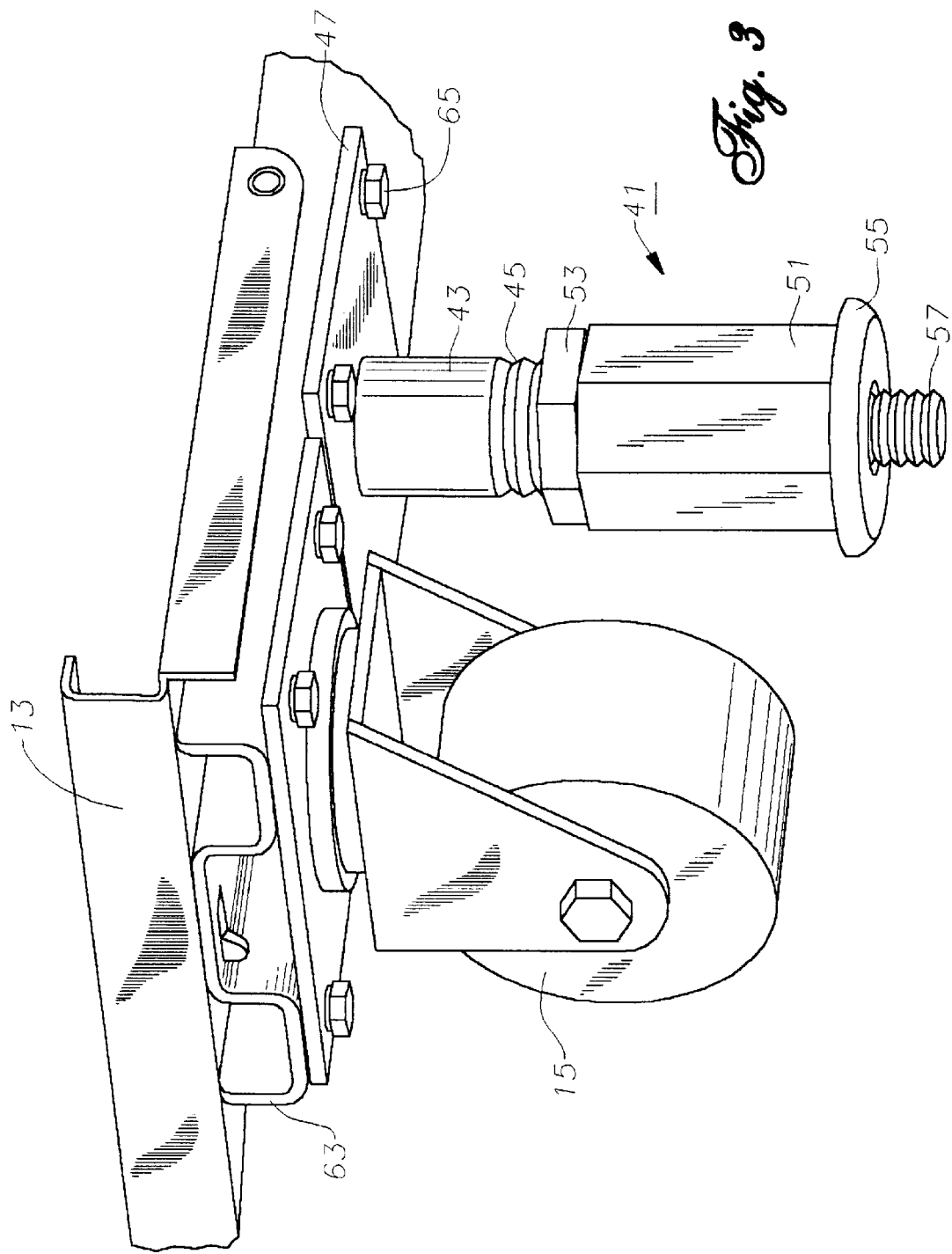
FIG. 3 is an isometric view of the floor anchor and leveler system of FIG. 2 mounted to the lower side of a rack.

In operation (FIGS. 3 and 4), a system 41 is secured to the underside structure of rack 11 near each caster 15 by fastening base plate 47 to caster channel 63 or other underside structure with fasteners 65. Jam nut 53 and leveler foot 51 are threaded onto external threads 45 and bolt 57 is inserted downward through a hole in base 13 and caster channel 63 (FIG. 4) into the system 41 assembly therebelow. The smooth insulator sleeve 46 inside leveler shaft 43 closely receives bolt 57 so that bolt 57 is coaxial with the other components. When properly assembled and prior to installation on floor, bolt 57 should extend at least one-half inch below insulator foot 55 (FIG. 3).

Rack 11 is ready to be anchored to the floor after all four systems 41 are mounted to it. Jam nut 53 and leveler foot 51 are loosely threaded onto leveler shaft 43 sufficiently high to allow caster 15 to contact and roll on floor 69. Rack 11 is then positioned on casters 15 until each of the floor anchor and leveler systems 41 is located and centered above its corresponding threaded floor plate anchor hole 59a. After positioning rack 11, the four tie-down bolts 57 are each installed coaxially through each leveler shaft 43 and loosely engage the threaded floor plate anchor holes 59a. Each leveler foot 51 is adjusted vertically to a desired position and jam nut 53 is tightened to lock the position. Tie-down bolts 57 are tightened to a prescribed specification to securely anchor the leveled rack 11 to the floor 69.

The invention has several advantages. The loads acting through the leveler foot and anchor bolt are coaxial. Hence, the high loads required to adequately preload the assembly are supported by the assembly itself and not by the rack base structure between separated anchor and leveler devices as with the conventional system. This feature eliminates the need to structurally reinforce the rack base frame. This design is also very compact which improves accessibility and ease of installation.

While the invention has been shown or described in only one of its forms, it should be apparent to those skilled in the art that it is not so limited, but is susceptible to various changes without departing from the scope of the invention.

We claim:

1. An apparatus, comprising:
   a portable rack for supporting equipment, the rack having a base with casters and a device for leveling and anchoring the rack to a floor, the device comprising:
   a mounting member having a generally cylindrical body and a perpendicular flange on one end of the body, the body having a smooth internal bore and external threads, and the flange being mounted to a lower surface of the base;
   a leveling member having internal threads which engage the external threads on the mounting member for selecting a vertical position of the leveling member relative to the mounting member for adjusting the distance between the base and the floor;
   a locking member for locking the leveling member from rotational movement relative to the mounting member at a selected position;
   a floor mounting plate adapted to be mounted to an upper surface of the floor between the leveling member and the floor, the floor mounting plate having a threaded hole;
   an anchor bolt adapted to secure the rack to the floor, the anchor bolt having a head located above the base, and a threaded shaft extending from the head through a hole in the base, the bore of the mounting member, and the leveling member to engage the threaded hole in the floor mounting plate for securing the rack from movement relative to the floor;
   an electrically insulated sleeve located between the anchor bolt and the mounting member; and
   an electrically insulated foot mounted between the leveling member and the floor mounting plate.

2. An apparatus, comprising:
   a portable rack for supporting equipment, the rack having a generally rectangular base with corners and a lower surface, and a caster mounted adjacent to each of its corners on its lower surface;
   a set of devices for leveling and anchoring the rack to a floor, each of the devices mounted adjacent to one of the corners of the base, and each of the devices comprising:
   a mounting member having a generally cylindrical body and a perpendicular flange on one end of the body, the body having a smooth internal bore and external threads, wherein the flange is mounted to the lower surface of the base;
   a leveling member having internal threads which engage the external threads on the mounting member for vertically positioning the leveling member relative to the mounting member to adjust the distance between the base and the floor;
   a jam nut mounted to the external threads on the mounting member for locking the leveling member from rotational movement relative to the mounting member at a selected position;
   a floor mounting plate having a threaded hole and adapted to be mounted to an upper surface of the floor between the leveling member and the floor;
   an anchor bolt adapted to secure the rack to the floor, the anchor bolt having a head located above the base, and a threaded shaft extending from the head through a hole in the base, the bore of the mounting member, and the leveling member to engage the threaded hole in the floor mounting plate for securing the rack from movement relative to the floor;
   an electrically insulated sleeve located between the anchor bolt and the mounting member; and
   an electrically insulated foot mounted between the leveling member and the floor mounting plate.

* * * * *